(12) United States Patent
Worley et al.

(10) Patent No.: US 10,311,008 B2
(45) Date of Patent: Jun. 4, 2019

(54) STORAGE DEVICE WITH NETWORK ACCESS

(71) Applicant: Samsung Electronics Co., Ltd., Suwon-si, Gyeonggi-do (KR)

(72) Inventors: Fred Worley, San Jose, CA (US); Sompong Paul Olarig, Pleasanton, CA (US); Harry Rogers, San Jose, CA (US); Jason Martineau, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 50 days.

(21) Appl. No.: 15/279,424

(22) Filed: Sep. 28, 2016

(65) Prior Publication Data

US 2018/0046594 A1 Feb. 15, 2018

Related U.S. Application Data

(60) Provisional application No. 62/374,739, filed on Aug. 12, 2016.

(51) Int. Cl.
*G06F 13/40* (2006.01)
*G06F 13/42* (2006.01)
*G06F 13/16* (2006.01)
*G06F 3/06* (2006.01)
*H04L 29/08* (2006.01)
*H04L 12/46* (2006.01)
*H05K 7/14* (2006.01)

(52) U.S. Cl.
CPC .......... *G06F 13/4068* (2013.01); *G06F 3/067* (2013.01); *G06F 3/0617* (2013.01); *G06F 3/0655* (2013.01); *G06F 13/16* (2013.01); *G06F 13/4022* (2013.01); *G06F 13/42* (2013.01); *H04L 12/4633* (2013.01); *H04L 67/1097* (2013.01); *H05K 7/1488* (2013.01)

(58) Field of Classification Search
None
See application file for complete search history.

(56) References Cited

U.S. PATENT DOCUMENTS 7,743,178 B2 * 6/2010 Warren ................. G06F 3/0607
370/466
8,059,961 B2 * 11/2011 Shimoosako ......... H04J 3/1694
370/249
8,412,041 B2 * 4/2013 Aboshi ................ H04B 10/073
398/66

(Continued)

OTHER PUBLICATIONS

'Useful Goods—Interesting products—SFP+-10G-SR—Widely Used Fiber Optical Transceivers' by offiber, wordpress, May 6, 2015.*

(Continued)

*Primary Examiner* — Steven G Snyder
(74) *Attorney, Agent, or Firm* — Renaissance IP Law Group LLP (57) ABSTRACT

Embodiments include a storage device, comprising: a chassis; non-volatile storage media disposed on the chassis; a network interface connector integrated with the chassis, wherein the network interface connector integrated with the chassis is structured to be directly inserted into a network switch; and control logic disposed on the chassis and configured to enable access to the non-volatile storage media through the network interface connector.

16 Claims, 7 Drawing Sheets

(56) References Cited

U.S. PATENT DOCUMENTS

| | | | |
|---|---|---|---|
| 8,417,119 B2* | 4/2013 | Shimoosako | H04Q 11/0067 398/58 |
| 8,423,690 B2* | 4/2013 | Slaight | G06F 13/4022 710/313 |
| 8,521,941 B2 | 8/2013 | Regula | |
| 9,003,090 B1 | 4/2015 | Davis | |
| 9,031,410 B2* | 5/2015 | Shimoosako | H04Q 11/0067 398/135 |
| 9,483,431 B2* | 11/2016 | Bergsten | H04L 67/1097 |
| 9,565,269 B2* | 2/2017 | Malwankar | H04L 67/2842 |
| 9,756,128 B2* | 9/2017 | Lomelino | H04L 67/1097 |
| 2006/0069884 A1* | 3/2006 | Kim | H04L 12/2812 711/154 |
| 2006/0230218 A1* | 10/2006 | Warren | G06F 3/0607 710/315 |
| 2006/0242312 A1* | 10/2006 | Crespi | G06F 3/0607 709/230 |
| 2008/0070439 A1* | 3/2008 | Kusuda | H01R 12/725 439/540.1 |
| 2009/0327588 A1 | 12/2009 | Sutardja et al. | |
| 2010/0215362 A1* | 8/2010 | Shimoosako | H04Q 11/0067 398/25 |
| 2013/0135816 A1* | 5/2013 | Huang | G06F 1/16 361/679.33 |
| 2013/0183038 A1* | 7/2013 | Shimoosako | H04Q 11/0067 398/66 |
| 2013/0246650 A1* | 9/2013 | Tsuboki | H04L 67/1097 709/236 |
| 2013/0315586 A1* | 11/2013 | Kipp | H04J 14/00 398/45 |
| 2013/0335907 A1* | 12/2013 | Shaw | G06F 1/183 361/679.31 |
| 2014/0369214 A1* | 12/2014 | Jinsong | H04L 43/50 370/252 |
| 2015/0120779 A1 | 4/2015 | Lin et al. | |
| 2015/0254088 A1 | 9/2015 | Chou et al. | |
| 2015/0373115 A1* | 12/2015 | Breakstone | G06F 11/2012 709/217 |
| 2016/0127492 A1* | 5/2016 | Malwankar | H04L 67/2842 709/212 |
| 2017/0220505 A1* | 8/2017 | Breakstone | G06F 13/4022 |
| 2017/0228328 A1* | 8/2017 | Armstrong | G06F 13/1673 |

OTHER PUBLICATIONS

'Small Form-factor Pluggable (SFP) Transceiver MultiSource Agreement (MSA),' Sep. 14, 2000.*

'NVM Express—Revision 1.2.1,' Jun. 5, 2016.*

NVM Express, "NVM Express over Fabrics 1.0," Revision 1.0, Jun. 5, 2016, (http://nvmexpress.org), 49 pages.

Seagate, "Wireless Plus," Mobile Device Storage, Data Sheet, Seagate Technology LLC, 2014, 2 pages.

* cited by examiner

STORAGE DEVICE WITH NETWORK ACCESS

CROSS-REFERENCE TO RELATED APPLICATIONS

This application claims the benefit of U.S. Provisional Patent Application No. 62/374,739, filed Aug. 12, 2016, the contents of which is hereby incorporated by reference herein, in its entirety, for all purposes.

BACKGROUND

This disclosure relates to storage devices and, in particular, storage devices with fabric access.

NVMe (NVM Express) over Fabrics is a standard based on the NVMe base specification. Storage equipment in a data center may implement NVMe over Fabrics. The storage equipment may include a processor connected to storage devices through an expansion bus, such as PCIe (PCI Express). The storage appliance may include a fabric interface, such as an interface for Ethernet, fibre channel, Infini-Band, or the like. Such storage equipment may be mounted in racks.

SUMMARY

Embodiments include a storage device, comprising: a chassis; non-volatile storage media disposed on the chassis; a network interface connector integrated with the chassis, wherein the network interface connector integrated with the chassis is structured to be directly inserted into a network switch; and control logic disposed on the chassis and configured to enable access to the non-volatile storage media through the network interface connector.

Embodiments include a storage device, comprising: a network interface; non-volatile storage media; and control logic coupled to the network interface and the non-volatile storage media and configured to: terminate data according to a storage protocol received through the network interface; and access the non-volatile storage media according to the terminated storage protocol without communicating through a connector.

Embodiments include a method, comprising: receiving data through a network interface of a storage device; terminating data according to a storage protocol in the storage device; and accessing non-volatile storage media of the storage device according to the terminated protocol.

DETAILED DESCRIPTION

The embodiments relate to storage devices with fabric access. The following description is presented to enable one of ordinary skill in the art to make and use the embodiments and is provided in the context of a patent application and its requirements. Various modifications to the embodiments and the generic principles and features described herein will be readily apparent. The embodiments are mainly described in terms of particular methods, devices, and systems provided in particular implementations.

However, the methods, devices, and systems will operate effectively in other implementations. Phrases such as "an embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of this disclosure. The embodiments will also be described in the context of particular methods having certain operations. However, the method and system may operate according to other methods having different and/or additional operations and operations in different orders and/or in parallel that are not inconsistent with the embodiments. Thus, embodiments are not intended to be limited to the particular embodiments shown, but are to be accorded the widest scope consistent with the principles and features described herein.

The embodiments are described in the context of particular systems or devices having certain components. One of ordinary skill in the art will readily recognize that embodiments are consistent with systems or devices having other and/or additional components and/or other features. Methods, device, and systems may also be described in the context of single elements. However, one of ordinary skill in the art will readily recognize that the methods and systems are consistent with the use of architectures having multiple elements.

It will be understood by those skilled in the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. Furthermore, in those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In some embodiments, a storage device is structured to have a network interface connector and/or chassis allowing the storage device to be directly inserted into a network switch. As will described in further detail below, a storage device may have a form-factor matching that of a port of a network switch. In particular, for a rack-mounted network switch, the storage device may be inserted into the port of the network switch without using any additional shelf space in the rack. As a result, unused ports of a rack-mounted network switch and, in particular, a network switch mounted in a rack with no additional shelf space may be filled with storage devices, increasing the available resources.

Figure 1:
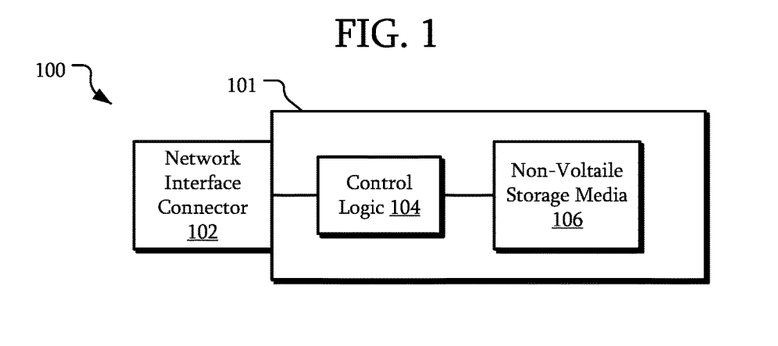
FIG. 1 is a schematic view of a storage device according to some embodiments.

FIG. 1 is a schematic view of a storage device according to some embodiments. In this embodiment, a storage device 100 includes a chassis 101, a network interface connector 102, control logic 104, and non-volatile storage media 106.

The network interface connector 102 is integrated with the chassis, and structured to be directly inserted into a network switch. In some embodiments, the network interface connector is a wired connector suitable for an Ethernet, fibre channel, InfiniBand, or other similar network or fabric.

The chassis 101 is a frame that supports the various components of the storage device 100. In some embodiments, the network interface connector 102 is integrated with the chassis such that at least some part of the chassis 101 is involved with mating the storage device to a network switch. In other embodiments, the network interface connector 102 may include structures related to mechanically interfacing with a network switch while the chassis 101 remains separate from the network switch when the storage device 100 is inserted.

The control logic 104 is circuitry that controls operation of the storage device 100. In some embodiments, the control logic 104 includes a general purpose processor, a digital signal processor (DSP), an application specific integrated circuit, a microcontroller, a programmable logic device, discrete circuits, a combination of such devices, or the like. The control logic 104 may include internal portions, such as registers, cache memory, processing cores, or the like, and may also include external and internal interfaces, such as address and data bus interfaces, interrupt interfaces, or the like. Although only one control logic 104 is illustrated in the storage device 100, multiple control logics 104 may be present and operate to implement various functions of the storage device 100 independently or in cooperation with each other. In addition, other interface devices, such as logic chipsets, hubs, memory controllers, communication interfaces, or the like may be part of the storage device 100 to connect the control logic 104 to internal and external components.

The non-volatile storage media 106 is disposed on the chassis 101. In some embodiments the non-volatile storage media 106 includes at least one nonvolatile memory, such as an electrically erasable programmable read-only memory (EEPROM), a flash memory, a phase change random access memory (PRAM), a resistance random access memory (RRAM), a magnetic random access memory (MRAM), a ferroelectric random access memory (FRAM), a nanofloating gate memory (NFGM), or a polymer random access memory (PoRAM), combinations of such memories or similar memories, or the like.

In some embodiments, the control logic 104 and the non-volatile storage media 106 are implemented as integrated circuits; these and other components can be mounted on a printed circuit board (PCB). The printed circuit board may be mounted on the chassis. As described above the network interface connector 102 is integrated with the chassis 101. In some embodiments, the printed circuit board is the electrical interface of the network interface connector 102 while the chassis 101 forms the mechanical interface. For example, one or more sides of the PCB may have traces that extend to an edge of the PCB. These traces may form the electrical interface to the storage device. The chassis 101 may be configured to mechanically align the network interface connector 102 as the storage device 100 is inserted into a corresponding socket so that the edge portion of the PCB including the traces is inserted into a connector within the socket.

The control logic 104 is configured to enable access to the non-volatile storage media 106 through the network interface connector. In some embodiments, the operations that the control logic 104 is configured to perform are limited to network and storage related operations. In particular, the network and storage related operations are operations related to accessing the non-volatile storage media 106. For example, network related operations may include managing a physical network interface and operating a network stack to process packets received from and transmitted to the network. The storage related operations may include receiving/transmitting commands/data according to a storage protocol encapsulated within a network protocol. In addition, storage related operations may include accessing and/or managing the non-volatile storage media 106 within the storage device 100, such as reading and writing data, managing the non-volatile storage media 106.

In some embodiments, the control logic 104 is configured to terminate one or more storage protocols and one or more network protocols. Terminating a protocol includes implementing an endpoint for that protocol. The data complying with the protocol is not forwarded to another device or system. Data encapsulated within the data complying with the protocol may be forwarded or used in some other manner, but the data complying with the protocol is not. For example, a User Datagram Protocol (UDP) packet may have data complying with nonvolatile memory express (NVMe) encapsulated within the payload of the UDP packet. As will be described below, in a storage appliance, a network stack implemented on a general purpose processor may terminate the UDP packet but forward the encapsulated NVMe data to a storage device through an expansion bus. Thus, data complying with UDP may be terminated by the general purpose processor while data complying the NVMe is forwarded on to the storage device. In contrast, in some embodiments, the control logic 104 would terminate both UDP and NVMe. That is, the UDP packet would be terminated similar to the storage appliance; however, the NVMe data would not be forwarded to another device or system. The NVMe data would be used to access the non-volatile storage media 106. Thus, the storage device 100 including the control logic 104 would be the endpoint for both UDP and NVMe packets/data.

In some embodiments, the control logic 104 is a lightweight application specific integrated circuit (ASIC) configured to terminate a storage protocol and network protocols. Once the commands/data according to the storage protocol are extracted from the network data, the control logic 104 is configured to access the non-volatile storage media 106. As a result, the storage device 100 need not include a general purpose processor connected to a motherboard with expansion bus interfaces for network cards, conventional storage devices, or the like. In contrast, the control logic 104 merely terminates the storage protocol and network protocols and directly accesses the non-volatile storage media 106 without an intermediary. In some embodiments, the control logic 104 does not include a general purpose processor and only includes an ASIC configured to terminate the storage protocol and network protocols.

In some embodiments, a connector is not disposed between the control logic 104 and the non-volatile storage media 106. In one example, the control logic 104 is mounted on a PCB. Integrated circuits forming the non-volatile storage media 106 are also mounted on the PCB. The control logic 104 and the non-volatile storage media 106 communicate without using a connector. In other embodiments, the control logic 104 and the non-volatile storage media 106 communicate without using an expansion bus such as small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), universal flash storage (UFS), Firewire, and/or the like.

Figure 2:
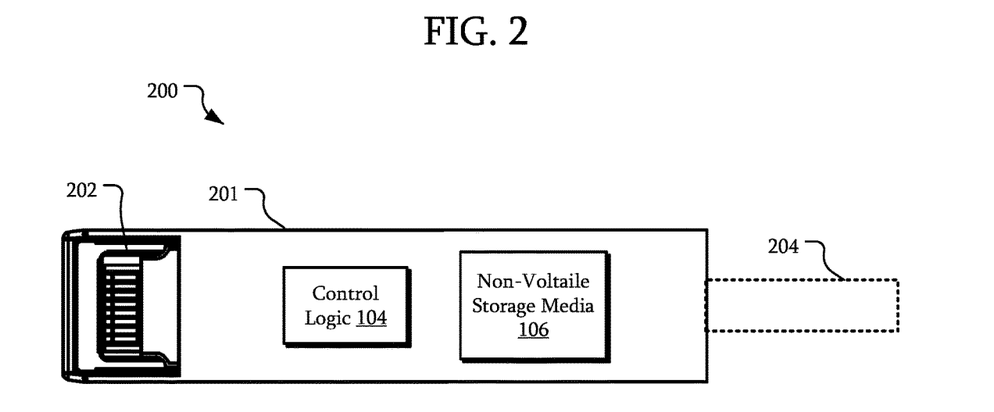
FIG. 2 is a schematic view of a SFP+ storage device according to some embodiments.

FIG. 2 is a schematic view of a $SFP_+$ storage device according to some embodiments. In this embodiment, the storage device 200 includes a chassis 201 that is integrated with network interface connector 202. Together, the chassis 201 and the network interface connector 202 comply with the enhanced small form-factor pluggable ($SFP_+$) form factor and electrical interface. As a result, the storage device 200 may be directly insertable into an $SFP_+$ port of a network switch.

Here, a cable 204 is illustrated as connected to the storage device 200. However, the cable 204 is illustrated with dashed lines to indicate that in some embodiments, no cable 204 is present. In particular, in some embodiments, the network interface connector 202 is the only electrical interface to the storage device 200. However, in other embodiments, the storage device 200 includes one or more other interfaces such as interfaces for external power, interfaces for other communication media such as an interface to an expansion bus, or the like. In still other embodiments, one or more of these other interfaces may be present in the storage device 200; however, the interfaces may be obscured by the chassis 201.

While a storage device with an $SFP_+$ form factor has been used as an example, in other embodiments, the storage device 200 may have other form factors. For example, the network interface connector may be integrated with the chassis to have a small form-factor pluggable (SFP), quad small form-factor pluggable (QSFP), or modular connector form factor, variants of such form factors or similar form factors, or another form factor that is insertable into a network switch port and through which network communications may be transmitted.

Figure 3:
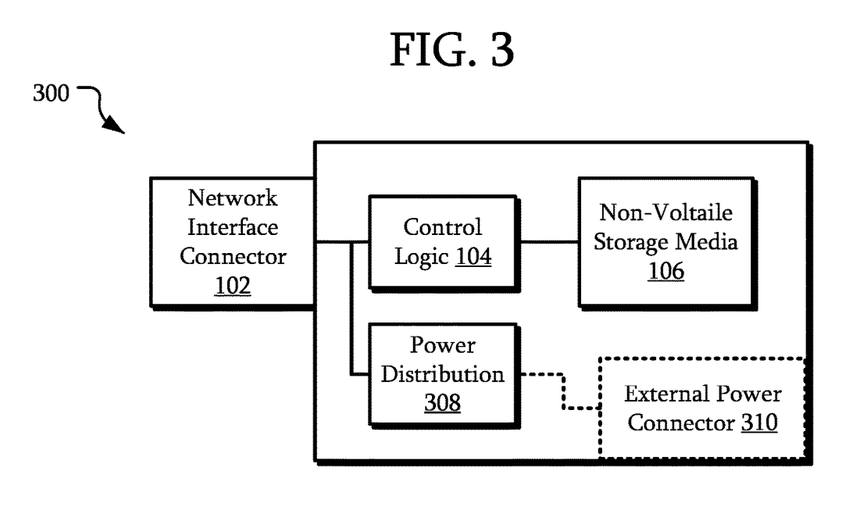
FIG. 3 is a schematic view of another storage device according to some embodiments.

FIG. 3 is a schematic view of another storage device according to some embodiments. In this embodiment, the storage device 300 is similar to the storage device 100 of FIG. 1. However, the storage device 300 includes power distribution circuit 308 disposed on the chassis and configured to receive power through the network interface connector. For example, in some embodiments, pins of the network interface connector 102 may be connected to the power distribution circuit 308. These pins may be defined as power and/or ground pins in a specification associated with the particular network interface connector 102. For example, one or more pins may be configured to receive +3.3 V and other pins may be configured to receive a ground. The power distribution circuit 308 includes traces, power regulators, power converters, filters, or the like to generate and/or supply appropriate power to the various components of the storage device 300.

In some embodiments, the network interface connector 102 may be the only electrical interface to the storage device 300. In particular, all of the communications and power are transmitted and received through the network interface connector 102. The storage device 300 may have no other electrical interface.

Although in some embodiments, power is supplied through dedicated pins of the network interface connector 102, in other embodiments, power may be obtained in other ways. For example, in some embodiments, the network interface connector 102 may be compatible with a power-over-Ethernet system. The power distribution circuit 308 may include circuitry to separate a common mode power supply from the differential data signals transmitted to and from the control logic 104. Although power-over-Ethernet has been used as an example of a technique to supply power to the storage device 300, in other embodiments, different techniques are used.

In some embodiments, the storage device 300 includes an external power connector 310 disposed on the chassis structured to receive electrical power. The external power connector 310 is separate from the network interface connector 102 and may be accessible while the storage device 300 is inserted into a network switch. In some embodiments, the entirety of the power supply of the storage device 300 is supplied from the external power connector 310. The power distribution circuit 308 may be configured to generate and/or supply power based on power received only from the external power connector 310. However, in other embodiments, the power distribution circuit 308 supplements power supplied through the network interface connector 102 with power supplied through the external power connector 310. For example, a maximum power supplied through power-over-Ethernet may be insufficient to power some or all of the functions of the storage device 300 at a particular level of performance. Accordingly, the remainder may be obtained through the external power connector 310.

Figure 4:
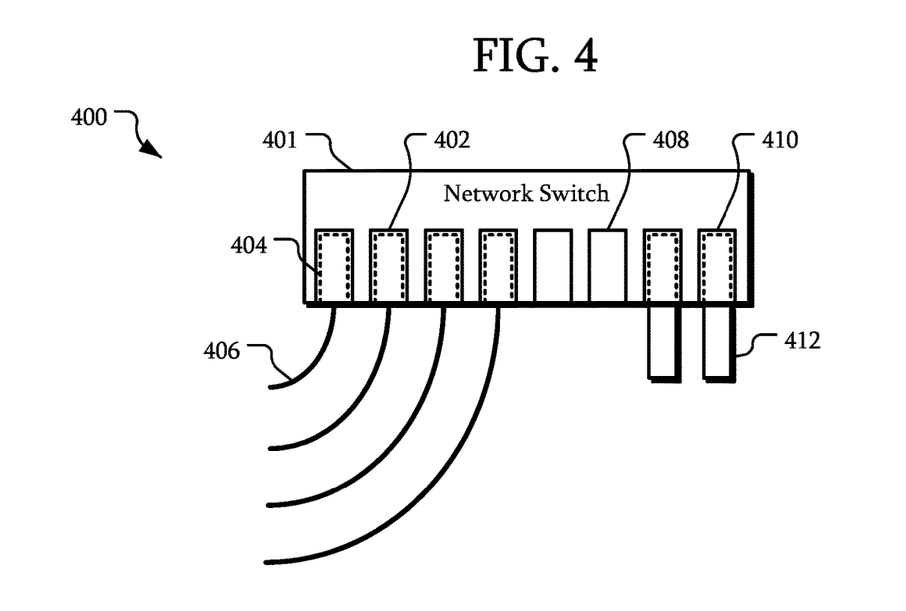
FIG. 4 is a schematic view of storage devices according to some embodiments inserted into a network switch.

FIG. 4 is a schematic view of storage devices according to some embodiments inserted into a network switch. In this embodiment, a system 400 includes a network switch 401 that includes multiple ports 402, 408, and 410. Connectors 404 of cable assemblies 406 are inserted in ports 402. The cable assemblies 406 may form connections to other components within a rack in which the network switch 401 is mounted. The network switch may also have unused ports 408.

Storage devices 412 are inserted into ports 410 of the network switch 401. As a result, the storage devices 412 are accessible by external components (such as servers) that are capable of communicating through the network switch 401.

As will be described in further detail below, in some embodiments, the network switch 401 may be installed in a rack. In some embodiments, such network switches 401 include ports in a QSFP+ or SFP+ form factor. As described above, the storage device 412 may have a QSFP+ or SFP+ form factor. Accordingly, such storage devices 412 may be directly inserted in to ports 410 of the network switch 401. Although some unused ports 408 are illustrated as examples, in some embodiments, storage devices 412 are inserted into all unused ports 408.

In other embodiments, the network switch 401 may be a standalone device. For example, the network switch 401 may be a consumer network switch 401 with 8P8C modular jacks. The storage devices 412 may be consumer storage devices 412 with an 8P8C modular plug. Accordingly, the storage devices 412 may be attached to a consumer's network and accessible as a storage device.

Figure 5A:
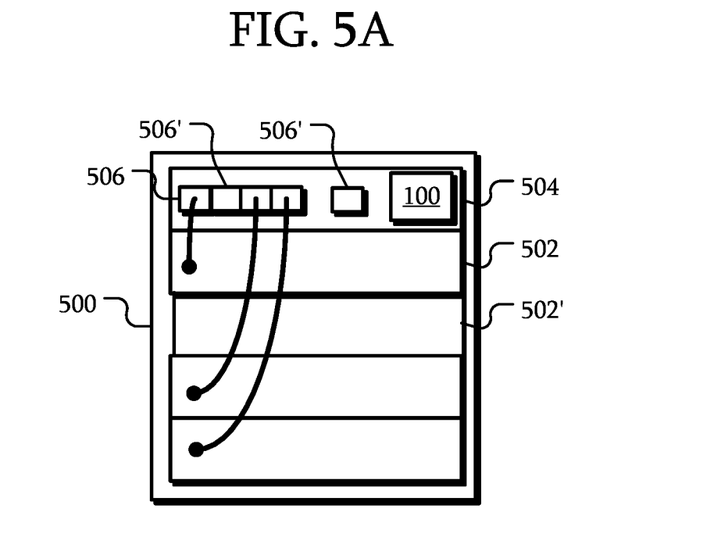
FIG. 5A is a schematic view of a rack including a storage device inserted into a network switch according to some embodiments.

FIG. 5A is a schematic view of a rack including a storage device inserted into a network switch according to some embodiments. In this embodiment, a rack 500 includes various rack-mounted equipment 502; however, not all available space, represented by shelf 502', is filled with rack-mounted equipment 502. A top-of-rack network switch 504 is mounted in the rack 500.

The top-of-rack network switch 504 includes several ports 506 connected to the rack-mounted equipment 502. In addition, the top-of-rack network switch 504 includes unused ports 506'. A storage device 100 according to an embodiment is inserted into one of the unused ports 506'. The storage device 100 need not be mounted in the rack in an available shelf, such as shelf 502'. That is, no additional rack space is needed or alternatively, existing rack space need not be used to expand the storage capacity of the system with the storage device 100. Moreover, another storage chassis and an additional downlink switch are not necessary. As a result, a cost of expanding storage is decreased.

While a particular number of rack-mounted equipment 502, ports 506, storage devices 100, available space in the rack 500, or the like have been used as examples, in other embodiments, different numbers of such components or structures may be present. In addition, although a top-of-rack network switch 504 has been used as an example of a network switch in which the storage device 100 has been inserted as an example, the storage device 100 may be inserted into different network switches within the rack.

Figure 5B:
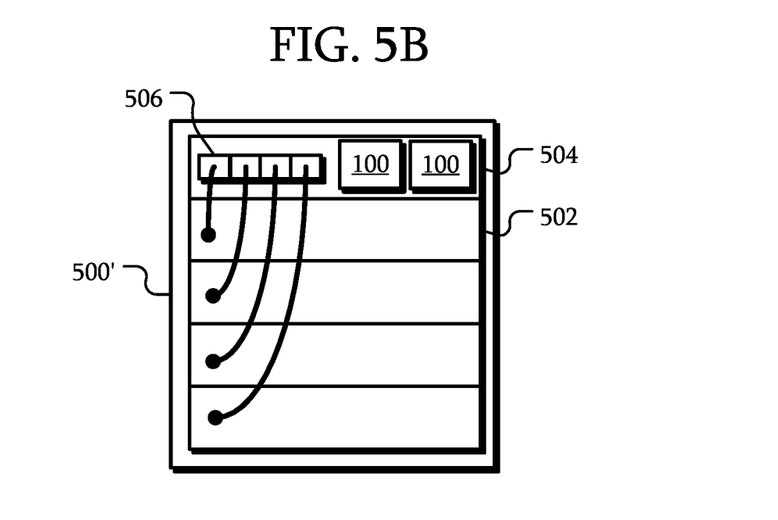
FIG. 5B is a schematic view of a rack including a storage device inserted into a network switch according to some other embodiments.

FIG. 5B is a schematic view of a rack including a storage device inserted into a network switch according to some other embodiments. In some embodiments, the rack 500' is a fully populated rack. For example, an amount of rack-mounted equipment 502 is a maximum for the size of the rack 500'. Some ports 506 of the network switch 504 are occupied; however, due to a mismatch between the number of connections required by the connections to the rack-mounted equipment 502 and the number of available ports on the network switch 504, some ports of the network switch 504 would otherwise be unused. In this embodiment, those ports that would otherwise be unused can be connected to storage devices 100. As these storage devices 100 are inserted directly into the network switch 504, additional rack space is not needed even in a fully populated rack. Accordingly, without provisioning a new rack or reconfiguring the existing rack 500', a network administrator may increase the available storage by inserting storage devices 100 into unused ports of the network switch 504.

In a particular example, a data center may have racks having heights in rack units (RU). The data center manager populates with rack with equipment. However, a common rack height is 44 RU while a number of ports in a network switch 504 is 48. As a result, an unused resource of additional ports may be wasted. However, as the storage device 100 has a form factor that allows it to be inserted into an unused port of the network switch 504, the unused resource is no longer wasted as it is used to connect additional storage. In fact, additional storage can be added even if all of the 44 RU space in the rack is already used. This transforms an unused, wasted resource into a new resource and allows for new options for a data center manager.

In some embodiments, a storage device 100 is globally addressable. That is, the storage device 100 may be accessed by any system that can communicate through the network switch 504. The storage device 100 need not be connected to an intermediary such as a server in order to be accessed.

Although a storage device 100 has been used as an example, any storage device described herein can be used. For example, in some embodiments, a storage device 300 is inserted into the network switch 504.

Figure 6A:
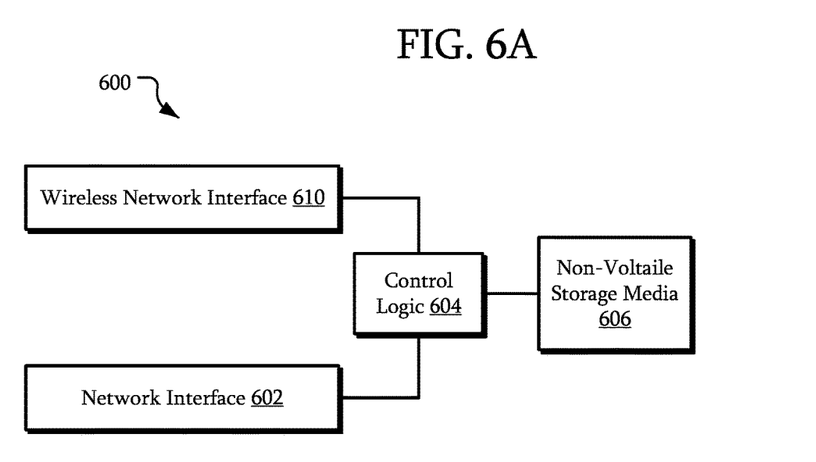
FIG. 6A is a block diagram of a storage device according to some embodiments.

FIG. 6A is a block diagram of a storage device according to some embodiments. In some embodiments, the storage device 600 is similar to the storage device 100 of FIG. 1. However, in this embodiment, the storage device 600 includes a wireless network interface 610. The wireless network interface 610 may include interfaces for WiFi, Bluetooth, or other wireless networks. The control logic 604 is further configured to enable access to the non-volatile storage media 606 through the wireless network interface 610.

Figure 6B:
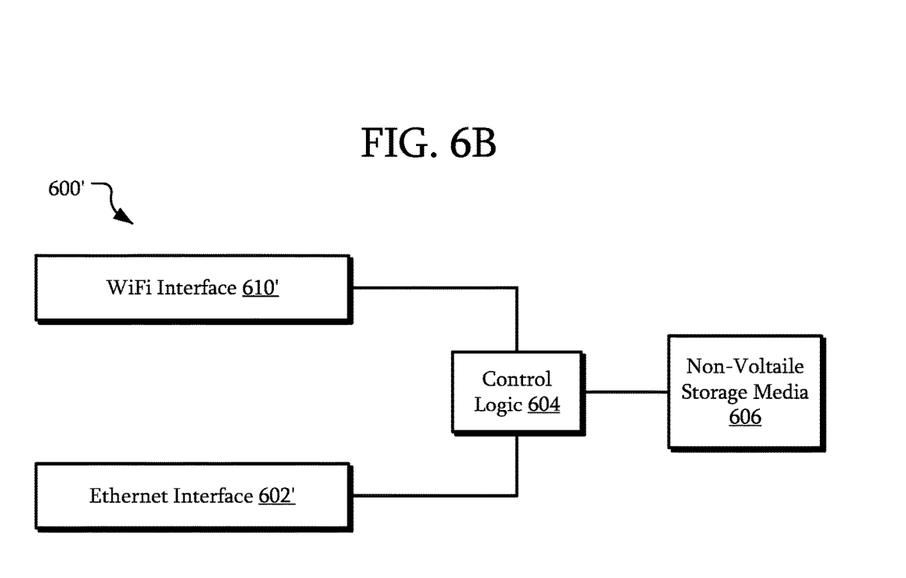
FIG. 6B is a block diagram of a storage device according to some other embodiments.

FIG. 6B is a block diagram of a storage device according to some other embodiments. In this embodiment, the storage device 600' includes control logic 604 and non-volatile storage media 606 similar to the storage device 600 of FIG. 6A. However, the storage device includes an Ethernet interface 602' and a WiFi interface 610'.

Figure 7A:
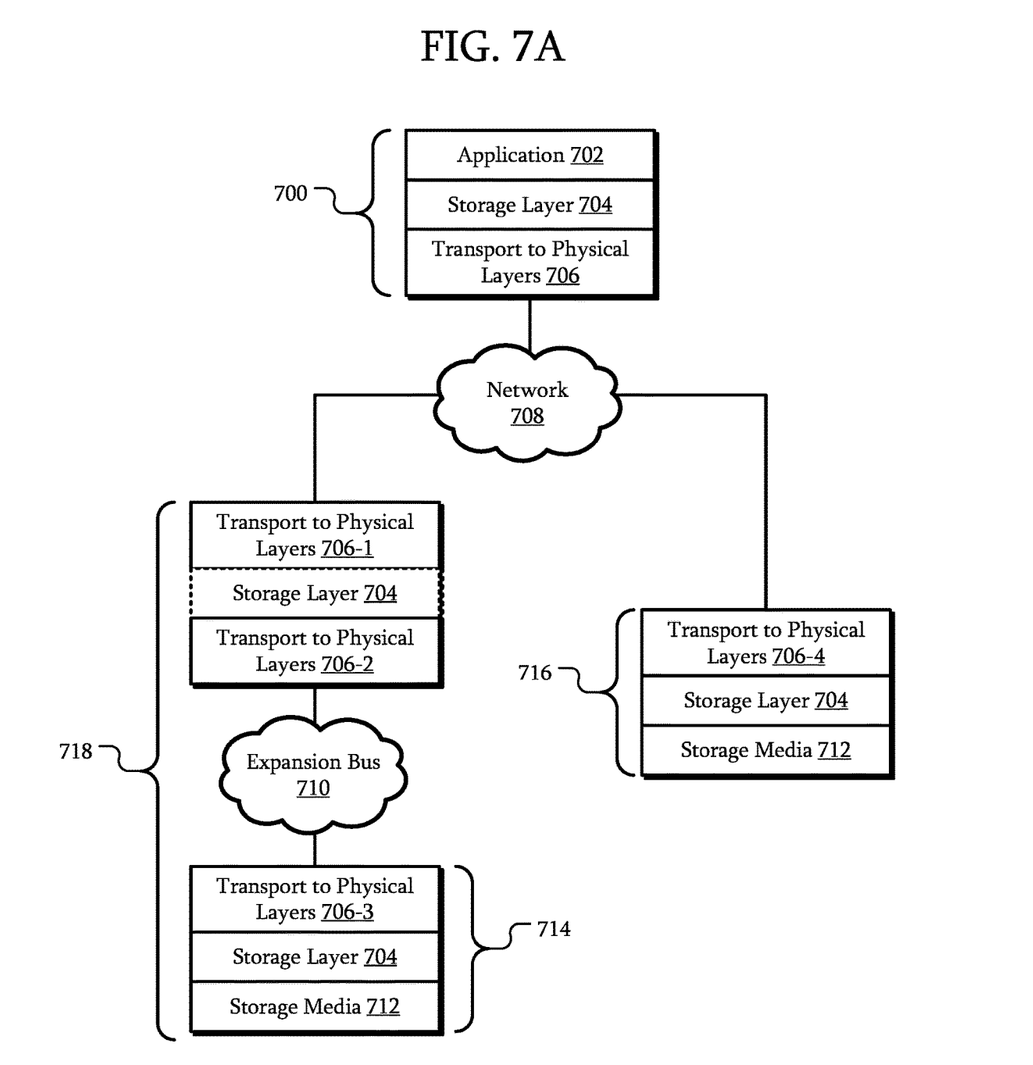
FIG. 7A is a block diagram of various layers involved in communication with a storage device according to some embodiments.

FIG. 7A is a block diagram of various layers involved in communication with a storage device according to some embodiments. Referring to FIG. 7A and using FIG. 1 as an example, hardware/software stacks of an initiator 700 and two targets 716 and 718. In some embodiments, the initiator 700 is a server or other system intending to access storage across the network 708. An application 702 generates an access request. The access request is processed by the storage layer 704. The transport to physical layer 706 represents various layers between the storage layer 704 and the physical network 708.

Using target 718 as a first example, the target 718 represents a storage appliance including one or more processors, network interfaces, and storage devices 714. The storage devices 714 may be coupled to the processor and/or the network interface through an expansion bus 710 such as those described above. In particular, an expansion bus 710 generally forms the interface between a processor and multiple peripheral components and/or adapters. For example, the expansion bus 710 may connect the processor to the storage device 714. In addition, the expansion bus 710 may connect a processor to a network card so that the processor may access the network 708. However, while expansion bus 710 may be used by the processor to communicate with a network card, the network 708 is not the interface the processor uses to communicate with components directly connected to the processor.

When an access is received by the target 718, the access traverses the transport to physical layers 706-1. The transport to physical layers 706-1 represent the various layers used to access the data associated with the storage layer. Here, the storage layer 704 is illustrated by dashed lines to represent that the associated storage protocol is not terminated here. In contrast, the storage layer 704 data is transmitted through the transport to physical layers 706-2 to transmit the data over the expansion bus 710 to the storage device 714.

At the storage device 714, the transport to physical layers 706-3 represent the various layers encapsulating the storage layer 704 data. Here, the associated storage protocol is terminated and the storage media 712 of the storage device 714 is accessed accordingly.

In contrast, target 716 is a storage device itself. The transport to physical layers 706-4 represent the various layers encapsulating the storage layer 704 data received over the network similar to transport to physical layers 706-1. However, at this point, the associated storage protocol is terminated in the storage layer 704 of the storage device. The storage media 712 is accessed without re-encapsulating the storage layer 704 data.

In some embodiments, storage media 712 is accessed without communicating through a connector. For example, the storage device 714 of target 718 may be one of many modular storage devices within the target 718. To communicate with such storage devices 718, communication passes through a connector associated with the expansion bus 710.

In some embodiments, the storage media 712 is accessed without an expansion bus 710. While an internal bus may be used in the target 716, an expansion bus 710 that is designed to interconnect a variety of components according to standardized protocols and electrical interfaces is not used. The additional overhead of re-encapsulating the storage layer 704 data is avoided in the target 716.

Referring to the storage device 100 of FIG. 1 as an example of a target 716, in some embodiments, the control logic 104 is further configured to terminate data according to a network transport protocol associated with the transport to physical layers 706 and 706-4 encapsulating the storage protocol. That is, the target 716 terminates the network transport protocol rather than acting as an intermediary as in target 718. In particular, the storage device presenting target 716 itself is configured to terminate network protocols in addition to terminating a storage protocol. In contrast, in target 718, a general purpose processor or similar device of the storage appliance terminates the network protocol and the storage device 714 of the storage appliance terminates the storage protocol.

Figure 7B:
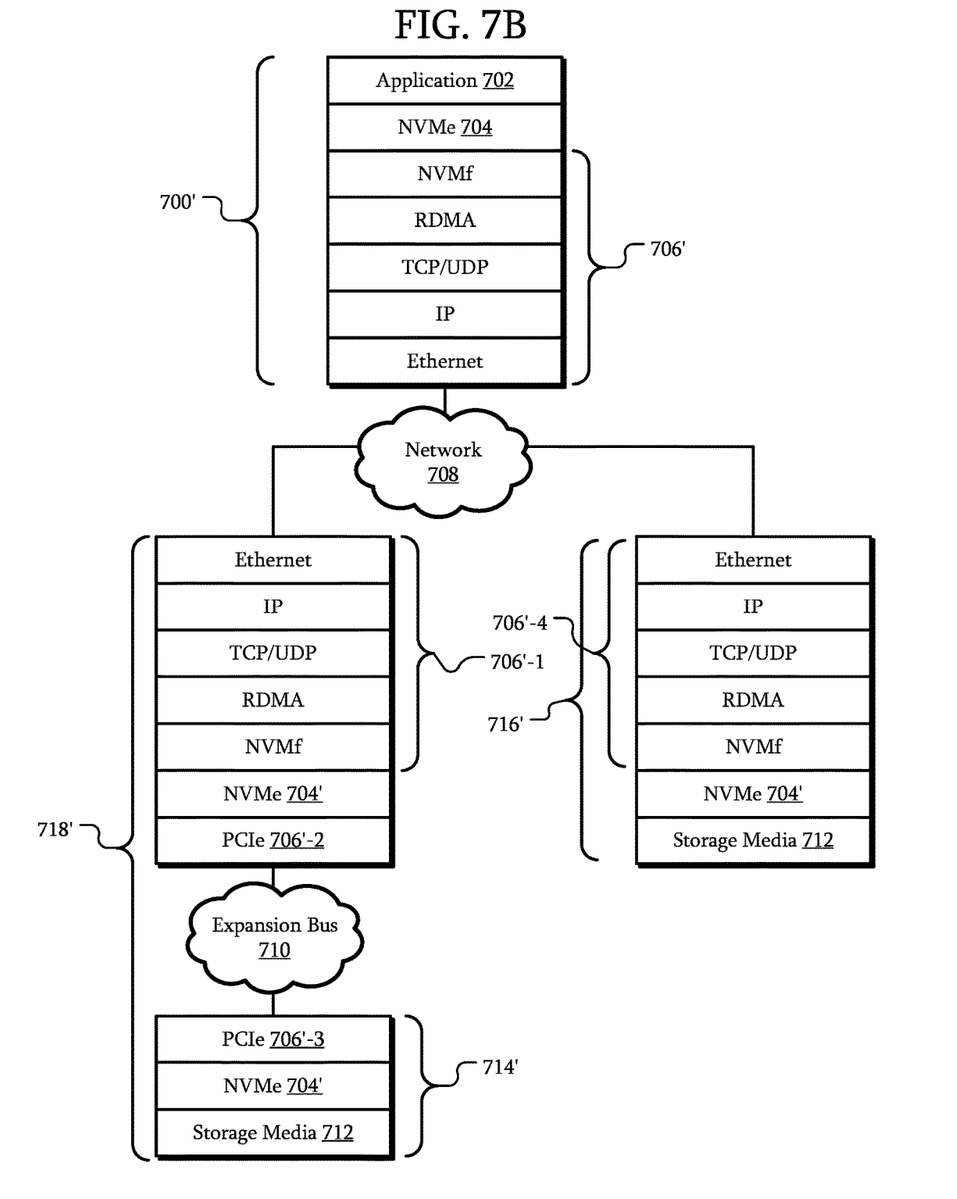
FIG. 7B is a block diagram of various layers involved in communication with a storage device according to some other embodiments.

FIG. 7B is a block diagram of various layers involved in communication with a storage device according to some other embodiments. In some embodiments, the initiator 700' and the targets 716' and 718' are similar to those of FIG. 7A. However, the transport to physical layers 706' includes NVMe over Fabrics (NVMf), remote direct memory access (RDMA), transmission control protocol (TCP) or user datagram protocol (UDP), internet protocol (IP), and Ethernet layers. The NVMe 704' data is encapsulated within these layers to be transmitted to the targets 716' and/or 718'.

In target 718', the transport to physical layers 706'-1 include layers similar to the transport to physical layers 706'. However, the NVMe layer 704' data is re-encapsulated for transmission over a PCIe bus 710' in the PCIe layer 706'-2. At the storage device 714', the NVMe layer 704' data is obtained from the PCIe layer 706'-3 and used to access the storage media 712.

In target 716', the transport to physical layers 706'-4 include layers similar to the transport to physical layers 706'. However, the resulting NVMe layer 704' data is not re-encapsulated. In contrast, the NVMe layer 704' data is used to access the storage media 712.

Although particular layers, protocols, and combinations of layer and protocols have been used as examples, in other embodiments, different layers and protocols may be used. Those explicitly identified are merely examples.

Figure 8:
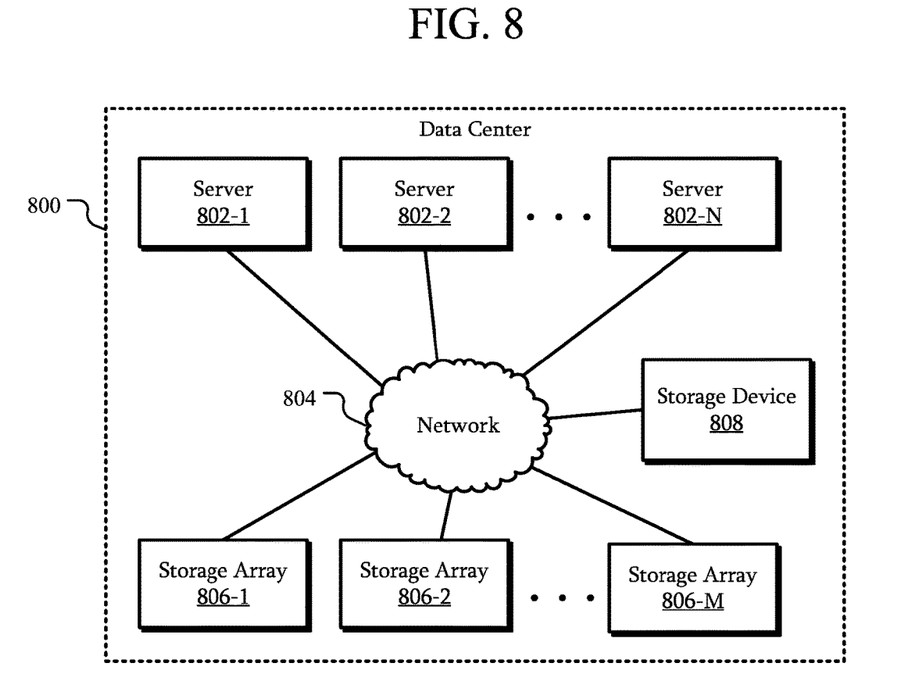
FIG. 8 is a schematic view of a data center according to some embodiments.

FIG. 8 is a schematic view of a data center according to some embodiments. In some embodiments, the data center 800 includes multiple servers systems 802-1 to 802-N. The server systems 802 are coupled to a network 804, such as the Internet. Accordingly, the server systems 802 may communicate through the network 804 with various storage arrays 806-1 to 806-M. For example, in some embodiments, the storage arrays 806 are rack mounted storage arrays. However, in addition to the storage arrays 806-1 to 806-M, additional storage in the storage device 808 is attached to the network 804. The storage device 808 is a storage device as described herein. In a particular example, the storage device 808 is a storage device directly inserted into a network switch of the network 804.

Although the structures, devices, methods, and systems have been described in accordance with particular embodiments, one of ordinary skill in the art will readily recognize that many variations to the disclosed embodiments are possible, and any variations should therefore be considered to be within the spirit and scope of the structures, devices, and systems disclosed herein. Accordingly, many modifications may be made by one of ordinary skill in the art without departing from the spirit and scope of the appended claims.

The invention claimed is:

1. A storage device, comprising:
   a chassis;
   non-volatile storage media disposed on the chassis;
   a network interface connector integrated with the chassis, wherein the network interface connector integrated with the chassis is structured to be directly inserted into a network switch and is configured to receive a network transport protocol encapsulating a storage protocol;
   control logic disposed on the chassis and configured to:
      serve as an endpoint for the network transport protocol encapsulating the storage protocol and the storage protocol;
      extract the storage protocol from the network transport protocol; and
      enable access to the non-volatile storage media through the network interface connector using the storage protocol extracted from the network transport protocol;
   an external power connector disposed on the chassis structured to receive electrical power;
   a power distribution circuit disposed on the chassis and configured to receive power through the network interface connector; and
   a wireless network interface,
   wherein the control logic is further configured to terminate a storage protocol received through the wireless network interface.

2. The storage device of claim 1,
wherein the network interface connector integrated with the chassis has a small form-factor pluggable (SFP), quad small form-factor pluggable (QSFP), or modular connector form factor.

3. The storage device of claim 1,
wherein the control logic is further configured to terminate data according to a storage protocol received through the network interface connector.

4. The storage device of claim 1,
wherein the control logic is further configured to only perform network and storage operations associated with accessing the non-volatile storage media.

5. The storage device of claim 1,
wherein the control logic is further configured to access the non-volatile storage media without re-encapsulating data associated with the access.

6. The storage device of claim 1,
wherein the control logic is further configured to access the non-volatile storage media without re-encapsulating data associated with the access in a transport protocol.

7. The storage device of claim 1,
wherein the control logic is further configured to access the non-volatile storage media without using an expansion bus.

8. A storage device, comprising:
a network interface for a fabric interface delivering a network transport protocol encapsulating a storage protocol, wherein the fabric interface includes an Ethernet, a fibre channel, or an InfiniBand;
non-volatile storage media;
control logic coupled to the network interface and the non-volatile storage media and configured to:
serve as an end point for the network transport protocol encapsulating the storage protocol and the storage protocol by terminating data according to the storage protocol received through the network interface and terminating data according to the network transport protocol encapsulating the storage protocol; and
access the non-volatile storage media according to a terminated storage protocol without re-encapsulating data associated with the access,
wherein the terminated storage protocol is extracted from the network transport protocol;
an external power connector disposed on the chassis structured to receive electrical power;
a power distribution circuit disposed on the chassis and configured to receive power through the network interface connector; and
a wireless network interface,
wherein the control logic is further configured to terminate a storage protocol received through the wireless network interface.

9. The storage device of claim 8,
wherein the network interface is a wired network interface.

10. The storage device of claim 8,
wherein the storage protocol is NVM Express (NVMe).

11. The storage device of claim 8,
wherein the control logic is further configured to access the non-volatile storage media without communicating through a connector.

12. The storage device of claim 8,
wherein the control logic is further configured to access the non-volatile storage media without communicating through an expansion bus.

13. A method, comprising:
at a storage device that includes a network interface and a wireless network interface, receiving data through one of the network interface of the storage device and the wireless network interface, wherein the network interface and the wireless network interface are for a fabric interface delivering a network transport protocol encapsulating a storage protocol;
terminating, by control logic of the storage device, data within the data received through the network interface according to the storage protocol and according to the network transport protocol encapsulating the storage protocol in the storage device;
terminating, by control logic of the storage device, a storage protocol received through the wireless network interface;
accessing, by the control logic of the storage device, non-volatile storage media of the storage device according to one of a terminated storage protocol from the network interface of the storage device and a terminated storage protocol from the wireless network interface,
wherein the terminated storage protocol is extracted from the network transport protocol received from one of the network interface and the wireless network interface;
the storage device including an external power connector; and
receiving power from a network interface connector or the external power connector.

14. The method of claim 13,
wherein receiving the data through the network interface of the storage device comprises receiving the data from a network switch directly attached to a network interface connector of the storage device.

15. The method of claim 13, wherein the storage protocol is NVM Express (NVMe).

16. The method of claim 13, wherein accessing the non-volatile storage media comprises accessing the non-volatile storage media without re-encapsulating the data within the data received through the network interface.

\* \* \* \* \*